(12) United States Patent
Jeong et al.

(10) Patent No.: US 11,527,488 B2
(45) Date of Patent: Dec. 13, 2022

(54) SEMICONDUCTOR PACKAGE AND METHOD FOR MANUFACTURING THE SAME

(71) Applicant: Ntrium Inc., Hwaseong-si (KR)

(72) Inventors: Se Young Jeong, Hwaseong-si (KR); Kisu Joo, Hwaseong-si (KR); Kyu Jae Lee, Hwaseong-si (KR); Seungjae Lee, Hwaseong-si (KR)

(73) Assignee: Ntrium Inc., Hwaseong-si (KR)

(*) Notice: Subject to any disclaimer, the term of this patent is extended or adjusted under 35 U.S.C. 154(b) by 0 days.

(21) Appl. No.: 17/235,055

(22) Filed: Apr. 20, 2021

(65) Prior Publication Data

US 2021/0327824 A1    Oct. 21, 2021

(30) Foreign Application Priority Data

Apr. 21, 2020  (KR) .................. 10-2020-0047972

(51) Int. Cl.
| | |
|---|---|
| *H01L 23/00* | (2006.01) |
| *H01L 23/552* | (2006.01) |
| *H01L 21/48* | (2006.01) |
| *H01L 21/78* | (2006.01) |

(52) U.S. Cl.
CPC ........ *H01L 23/552* (2013.01); *H01L 21/4853* (2013.01); *H01L 21/78* (2013.01); *H01L 24/16* (2013.01); *H01L 2224/16227* (2013.01); *H01L 2924/3025* (2013.01)

(58) Field of Classification Search
CPC ... H01L 23/552; H01L 21/4853; H01L 21/78; H01L 24/16; H01L 2224/16227; H01L 2924/3025; H01L 23/3128; H01L 23/49816; H01L 23/60; H01L 25/072; H01L 23/293; H01L 23/31
See application file for complete search history.

(56) References Cited

U.S. PATENT DOCUMENTS

| | | | |
|---|---|---|---|
| 10,347,826 B1* | 7/2019 | Bhushan | H01L 24/11 |
| 2018/0033738 A1* | 2/2018 | Kawabata | H01L 23/49838 |
| 2020/0373248 A1* | 11/2020 | Shirakami | H01L 23/552 |

FOREIGN PATENT DOCUMENTS

| | | |
|---|---|---|
| JP | 02-065158 A | 3/1990 |
| JP | 2018-018867 A | 2/2018 |
| KR | 10-2015-0142653 A | 2/2017 |

\* cited by examiner

*Primary Examiner* — Thanh T Nguyen
(74) *Attorney, Agent, or Firm* — Maier & Maier, PLLC

(57) ABSTRACT

A semiconductor package includes a magnetic layer including an inner portion having a predetermined area and an outer portion disposed outward of the inner portion, a lower polymer layer disposed below the magnetic layer, and a dicing surface formed by ends of the magnetic layer and the lower polymer layer and extending along a stacked direction of the magnetic layer and the lower polymer layer. At least a part of the outer portion of the magnetic layer includes an inclined surface inclined downward in the stacked direction, and has a thickness greater than a thickness of the inner portion in the stacked direction.

16 Claims, 10 Drawing Sheets

SEMICONDUCTOR PACKAGE AND METHOD FOR MANUFACTURING THE SAME

TECHNICAL FIELD

The present disclosure relates to a semiconductor package and a method of manufacturing the semiconductor package.

BACKGROUND

Magnetic metal foil of an electromagnetic interference (EMI) shielding film included in a semiconductor package has high electrical conductivity of $50 \times 10^{-6}$ $\Omega$cm to $500 \times 10^{-6}$ $\Omega$cm. When a magnetic layer, which is the magnetic metal foil, is contacted with a conductive layer, the conductivity of the magnetic layer may be relatively increased, and thus, EMI shielding performance in a radio-frequency band may be improved.

On the other hand, in order to reduce contact resistance when the magnetic layer and the conductive layer are contacted with each other in manufacturing processes of the semiconductor package, it may be advantageous to increase a contact area between the magnetic layer and the conductive layer. However, when the contact area between the magnetic layer and the conductive layer is increased, it is necessary to prevent an influence, by deformation of the magnetic layer, on a post process after the magnetic layer and the conductive layer are contacted (for example, physical vapor deposition (PVD) for forming the conductive layer and/or paste spray, etc.)

Accordingly, in order to improve the EMI shielding performance of the semiconductor package using the EMI shielding film, development of a technology that controls a physical property of a polymer layer of the EMI shielding film and a dicing process (or singulation) among the manufacturing processes, and thus does not affect the post process while increasing the contact area between the magnetic layer and the conductive layer is required.

SUMMARY

An embodiment of the present disclosure is to provide a semiconductor package of which EMI shielding performance is improved and a method of manufacturing the semiconductor package. For example, in an embodiment of the present disclosure, a magnetic layer and a conductive layer may be contacted with each other in order to provide the semiconductor package with the improved EMI shielding performance, and at this time, in order to reduce contact resistance that may occur, a technology that does not affect a post process while increasing a contact area between the magnetic layer and the conductive layer may be provided. For example, by controlling physical properties of a polymer layer of an EMI shielding film included in the semiconductor package and a dicing process among manufacturing processes of the semiconductor package, the technology that does not affect the post process while increasing the contact area between the magnetic layer and the conductive layer may be provided.

In accordance with a first aspect of the present disclosure, there is provided a semiconductor package including: a magnetic layer including an inner portion having a predetermined area and an outer portion disposed outward of the inner portion; a lower polymer layer disposed below the magnetic layer; and a dicing surface formed by ends of the magnetic layer and the lower polymer layer and extending along a stacked direction of the magnetic layer and the lower polymer layer, wherein at least a part of the outer portion of the magnetic layer includes an inclined surface inclined downward in the stacked direction, and has a thickness greater than a thickness of the inner portion in the stacked direction.

The semiconductor package may further include a conductive layer disposed above the magnetic layer.

The semiconductor package may further include an upper polymer layer disposed above the magnetic layer.

The at least the part of the outer portion of the magnetic layer may further include an inclined surface inclined upward in the stacked direction The semiconductor package may further include a conductive layer disposed above the upper polymer layer.

The semiconductor package may further include a first adhesive layer interposed between a lower surface of the upper polymer layer and an upper surface of the magnetic layer.

The semiconductor package may further include a second adhesive layer interposed between an upper surface of the lower polymer layer and a lower surface of the magnetic layer.

Each of the lower polymer layer and the upper polymer layer may include a polymer resin and a filler, and a mixing ratio of the polymer resin and the filler may be a ratio of 30% to 70% through 90% to 10%.

A thickness of each of the lower polymer layer and the upper polymer layer may be 5 μm to 50 μm.

A modulus of each of the lower polymer layer and the upper polymer layer may be 50 MPa to 50 GPa.

The semiconductor package may further include: a printed circuit board; a semiconductor chip disposed on the printed circuit board; and a protective layer of the semiconductor chip, wherein the protective layer may be disposed on the printed circuit board, and the lower polymer layer may be disposed above the protective layer.

At least one of an adhesion strength between the protective layer and the lower polymer layer, an adhesion strength between the magnetic layer and the upper polymer layer, and an adhesion strength between the magnetic layer and the lower polymer layer is 0.5 Kgf/25 mm or more.

In accordance with a second aspect of the present disclosure, there is provided a method of manufacturing a semiconductor package, the method including: manufacturing a film structure including a magnetic layer, and a lower polymer layer disposed below the magnetic layer; stacking the film structure on a semiconductor chip disposed on a circuit board; and dicing at least a portion of a stacked structure formed by the stacking so that at least a part of an outer portion of the magnetic layer has a thickness greater than a thickness of an inner portion of the magnetic layer, wherein, in the dicing, the at least the part of the outer portion includes an inclined surface inclined downward in a stacked direction of the magnetic layer and the lower polymer layer.

In the manufacturing, an upper polymer layer may be disposed above the magnetic layer.

In the dicing, the at least the part of the outer portion may further include an inclined surface inclined upward in the stacked direction.

A rotation speed of a rotating and cutting equipment may be predetermined for each of predetermined forms of the outer portions, and the equipment may be controlled to rotate at the predetermined rotation speed corresponding to one of the predetermined forms of the outer portions in the dicing.

The semiconductor package and the method of manufacturing the semiconductor package according to an embodiment of the present disclosure may improve the EMI shielding performance. For example, in an embodiment of the present disclosure, the magnetic layer and the conductive layer may be contacted with each other in order to provide the semiconductor package with the improved EMI shielding performance, and at this time, in order to reduce the contact resistance that may occur, the technology that does not affect the post process while increasing the contact area between the magnetic layer and the conductive layer may be provided.

DETAILED DESCRIPTION OF THE EMBODIMENTS

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

The terms used in the present specification will be briefly described, and the present invention will be described in detail.

In terms used in the present disclosure, general terms currently as widely used as possible while considering functions in the present disclosure are used. However, the terms may vary according to the intention or precedent of a technician working in the field, the emergence of new technologies, and the like. In addition, in certain cases, there are terms arbitrarily selected by the applicant, and in this case, the meaning of the terms will be described in detail in the description of the corresponding invention. Therefore, the terms used in the present disclosure should be defined based on the meaning of the terms and the overall contents of the present disclosure, not just the name of the terms.

When it is described that a part in the overall specification "includes" a certain component, this means that other components may be further included instead of excluding other components unless specifically stated to the contrary.

Hereinafter, the embodiment of the present disclosure will be described in detail with reference to the accompanying drawings so that those of ordinary skill in the art may easily implement the present disclosure. In describing the embodiments of the present disclosure, if it is determined that detailed description of related known components or functions unnecessarily obscures the gist of the present disclosure, the detailed description thereof will be omitted. Further, the terminologies to be described below are defined in consideration of functions of the embodiments of the present disclosure and may vary depending on a user's or an operator's intention or practice. Accordingly, the definition thereof may be made on a basis of the content throughout the specification.

Figure 1:
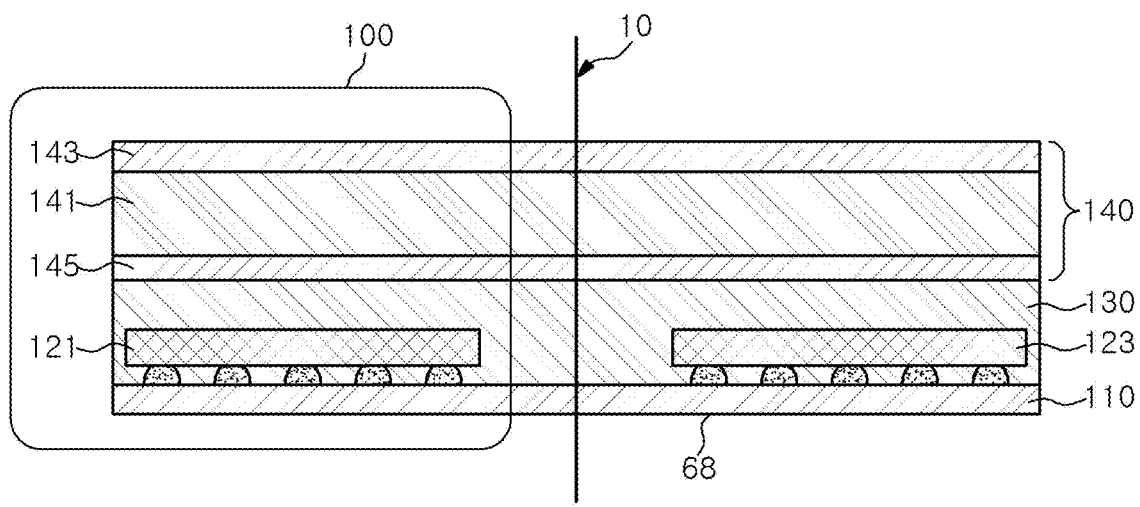
FIG. 1 shows a diagram illustrating a dicing process when manufacturing a semiconductor package according to an embodiment of the present disclosure.

FIG. 1 shows a diagram illustrating a dicing process when manufacturing a semiconductor package 100 according to an embodiment of the present disclosure.

Referring to FIG. 1, the semiconductor package 100 may include a circuit board, for example, a printed circuit board (PCB) strip 110 (also referred to as a printed circuit board or circuit board), semiconductor chips, for example, a first semiconductor chip 121 and a second semiconductor chip 123, a protective layer 130 of the semiconductor chips, and a film structure 140. The film structure 140 may include a magnetic layer 141, a first polymer layer 143 and a second polymer layer 145.

According to the embodiment of the present disclosure, the first semiconductor chip 121 and the second semiconductor chip 123 may be disposed on the PCB strip 110. The first semiconductor chip 121 and the second semiconductor chip 123 may be arranged with a predetermined interval. According to an epoxy molding process, an epoxy molding compound (EMC) 130, which is the protective layer 130 of the first semiconductor chip 121 and the second semiconductor chip 123, may be formed, and the film structure 140 may be placed on the EMC 130. The first polymer layer 143 may be disposed on an upper surface of the magnetic layer 141, and the second polymer layer 145 may be disposed on a lower surface of the magnetic layer 141. The first polymer layer 143 and the second polymer layer 145 may be referred to as an upper polymer layer 143 and a lower polymer layer 145, respectively.

According to an embodiment, through the dicing process, in a stacked structure of the semiconductor package 100 described above, a plurality of semiconductor packages 100 may be manufactured by dicing a center 10 between the first semiconductor chip 121 and the second semiconductor chip 123.

Figure 2:
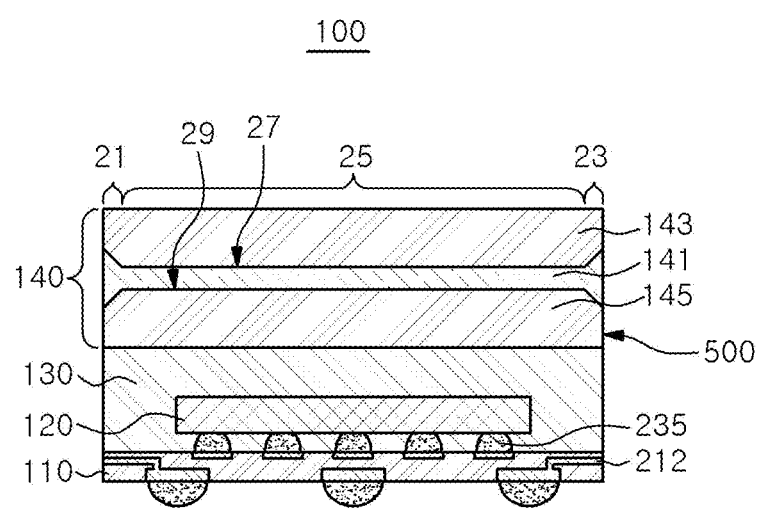
FIG. 2 shows a diagram illustrating the semiconductor package according to the embodiment of the present disclosure.

FIG. 2 shows a diagram illustrating the semiconductor package according to the embodiment of the present disclosure.

Referring to FIG. 2, the semiconductor package 100 may include a circuit board, for example, the PCB strip 110, a semiconductor chip 120 and/or the film structure 140. The film structure 140 may include the magnetic layer 141, the first polymer layer 143 and the second polymer layer 145. Further, the semiconductor package 100 may further include a dicing surface 500. The dicing surface 500 may extend in the stacked direction of the magnetic layer 141, the first polymer layer 143, and the second polymer layer 145, and may include at least one end of the magnetic layer 141, the first polymer layer 143, and the second polymer layer 145.

According to the embodiment of the present disclosure, the semiconductor chip 120 may be disposed on the PCB strip 110, and the film structure 140 may be disposed on the semiconductor chip 120. A conductive adhesive member 235 may be used in order for a circuit 212 included in the PCB strip 110 to be electrically connected to the semiconductor chip 120. In addition, the protective layer 130 of the semiconductor chip 120 may be disposed on the PCB strip 110. For example, the EMC 130, which is the protective layer 130 of the semiconductor chip 120, may be formed through an epoxy molding process, and accordingly, the EMC 130 may be disposed on the PCB strip 110. In addition, the film structure 140 may be disposed on an upper surface of the EMC 130.

In a case of the film structure 140, the first polymer layer 143 is disposed (or formed or attached) on an upper surface 27 (or also referred to as a first surface) of the magnetic layer 141, and the second polymer layer 145 may be disposed (or formed or attached) on a lower surface 29 (or also referred to as a second surface) of the magnetic layer 141. The EMC 130 may be disposed on a lower surface of the second polymer layer 145. Here, the first polymer layer 143 and the second polymer layer 145 may be referred to as an upper polymer layer 143 and a lower polymer layer 145, respectively.

On the other hand, although not shown, a conductive layer (not shown) may be disposed on the first polymer layer 143.

According to the embodiment of the present disclosure, if a modulus of polymer layers included in the film structure 140, which is an EMI shielding film for shielding near field in a low frequency of the semiconductor package 100 manufactured through the above-described dicing process, that is, the modulus of the first polymer layer 143 and the second polymer layer 145 are low, because deformation of magnetic metal foil, which is the magnetic layer 141, is significantly large in the dicing process among manufacturing processes of the semiconductor package 100, a case where a post process after the dicing process is impossible occurs. Further, if a dicing blade used in the dicing process has a large roughness or the dicing blade has a low performance, deformation of the magnetic metal foil (e.g., deformation of the magnetic layer 141), is significantly large so that the post process may be impossible. In addition, if there is no increase of an area of the magnetic layer 141 which is the magnetic metal foil after the dicing process, the magnetic layer 141 has a high contact resistance between the magnetic layer 141 and the EMC 130 in contact with the magnetic layer 141, and thus an EMI shielding effect may be reduced in a radio-frequency band.

Accordingly, in the embodiment of the present disclosure, to manufacture the semiconductor package 100, after attaching the film structure 130 to the upper surface of the EMC 130, the contact resistance with the EMC 130 may be reduced when performing dicing in the dicing process by mixing ductility of the magnetic metal foil, which is the magnetic layer 141 of the film structure 140, and stiffness of the polymer layers of the film structure 140, that is, the first polymer layer 143 and the second polymer layer 145, and thereby increasing an area of a side surface of the magnetic metal foil.

For example, as shown in FIG. 2, the magnetic layer 141 includes at least a part of an outer portion, for example, a first portion 21 and a second portion 23, which has a thickness greater than that of an inner portion 25 corresponding to a stacked direction of the components of the semiconductor package 100. For example, except for the first portion 21 and the second portion 23, the upper surface 27 and the lower surface 29 of the inner portion 25 may be flat, and at least a part of the first portion 21 may have a form in which an area is extended in at least one of an upward direction and a downward direction, and at least a part of the second portion 23 may have a form in which an area is extended in at least one of the upward direction and the downward direction. For example, the form in which the area is extended may include at least one of a form including an inclined surface formed in the upward direction and a form including an inclined surface formed in the downward direction. In other words, at least a part of the outer portion of the magnetic layer 141, for example, the first portion 21 and the second portion 23, may include inclined surfaces which inclined upward or downward along a direction in which the magnetic layer 141 and the polymer layers 143, 145 are stacked.

For example, when the area of at least a part of the first portion 21 is increased in the upward direction and/or downward direction, and the area of at least a part of the second portion 23 is increased in the upward direction and/or downward direction, an area increase rate may be set to 5% to 300%.

On the other hand, the magnetic layer 141 may include at least one of an iron-nickel alloy (FeNi), steel, iron-silicon alloy, cobalt (Co), iron oxide ($Fe_2O_3$, $Fe_3O_4$), chromium oxide, sendust, ferrite, permalloy, nanocrystals, magnetic nanoparticles, and amorphous magnetic particles, or mixed particles thereof. The FeNi may include iron (Fe), nickel (Ni) and the permalloy, and the steel may include stainless steel, and the ferrite may include FeMn-based ferrite or FeZn-based ferrite, but is not limited thereto. The sendust may have magnetic particles in a form of powder of an alloy in which aluminum, silicon, etc. are added to the Fe, and these magnetic particles may be provided in a form of soft magnetic powder including amorphous magnetic powder or a magnetic nanocrystal powder, or the like.

For example, as shown in FIG. 2, an upper surface of the first polymer layer 143 may be flat and a length and width of the first polymer layer 143 may correspond to a length and width of the magnetic layer 141. The first polymer layer 143 may serve as an adhesive, and may also be referred to as a first adhesive layer.

For example, as shown in FIG. 2, the lower surface of the second polymer layer 145 may be flat and a length and width of the second polymer layer 145 may correspond to the length and width of the magnetic layer 141. The second polymer layer 145 may also be referred to as a second adhesive layer.

According to the embodiment of the present disclosure, in order for the film structure 140 to serve as the EMI shielding film for shielding the near field in a low frequency, materials and physical properties of the polymer layers of the film structure 140, that is, the first polymer layer 143 and the second polymer layer 145, may be determined.

For example, the first polymer layer 143 and the second polymer layer 145 may each include a polymer resin and a filler.

The polymer resin may be a resin that has excellent bonding between the EMC of the semiconductor package 100 and the magnetic metal foil which is a magnetic material, and has passed a reliability test such as thermal cycling test at −55° C. through 125° C. For example, the polymer resin may be a curing resin with excellent metal adhesion which is an epoxy-based, acrylic-based, or urethane-based, etc.

The filler may maintain a thickness and shape of each of the first polymer layer 143 and the second polymer layer 145, and may be a ceramic material for increasing the modulus. For example, the filler may be ceramic powder such as $Al_2O_3$, $TiO_2$, or $SiO_2$ having a maximum diameter of 25 μm or less.

A mixing ratio of the polymer resin and the filler may be a ratio of 30% to 70% through 90% to 10%.

According to the embodiment of the present disclosure, main conditions for manufacturing the semiconductor package 100, for example, the thickness of the polymer layers, the modulus of the polymer layers, the adhesion strength between the components of the semiconductor package 100, etc. may be set as follows.

The thickness of each of the first polymer layer 143 and the second polymer layer 145 may be 10 μm through 100 μm.

The modulus of each of the first polymer layer 143 and the second polymer layer 145 may be set 50 MPa through 50 GPa.

The adhesion strength between the second polymer layer 145 and the EMC 130, the adhesion strength between the magnetic layer 141 and the second polymer layer 145, and the adhesion strength between the magnetic layer 141 and the first polymer layer 143 may be set more than 0.5 Kgf/25 mm.

The above-described main conditions were determined by experiments of manufacturing a part of the semiconductor package 100, and FIGS. 3A to 3D show diagrams illustrating images resulting from the experiments of manufacturing a part of the semiconductor package 100 according to the embodiment of the present disclosure.

Referring to FIGS. 3A to 3D, cross-sectional images after attaching the film structure 140 to the EMC by experimental conditions according to an embodiment of the present disclosure may be identified. For example, when attaching the film structure 140 to the EMC, by setting differently the experimental conditions such as the thickness of the polymer layers, the modulus of the polymer layers, and the adhesion strength between the polymer layers and the magnetic material, and then dicing, the cross-sectional images as shown in FIGS. 3A to 3D are derived.

Figure 3A:
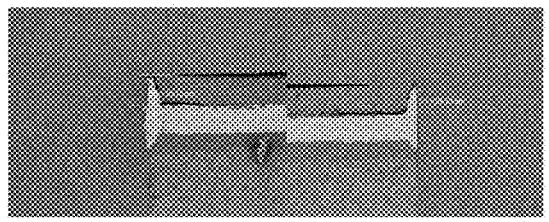
FIG. 3A shows a diagram illustrating an image resulting from experiments of manufacturing a part of the semiconductor package according to the embodiment of the present disclosure.

FIG. 3A shows a cross-sectional image after attaching the film structure 140 to the EMC in a case that the thickness is 20 μm, the modulus is 1 GPa, and the adhesion strength is 800 gf/25 mm.

Figure 3B:
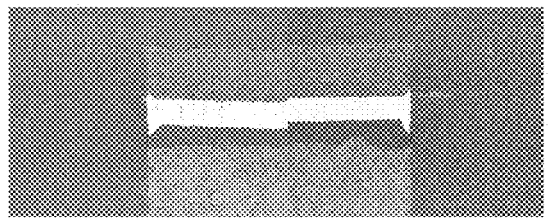
FIG. 3B shows a diagram illustrating an image resulting from experiments of manufacturing a part of the semiconductor package according to the embodiment of the present disclosure.

FIG. 3B shows a cross-sectional image after attaching the film structure 140 to the EMC in a case that the thickness is 50 μm, the modulus is 1 GPa, and the adhesion strength is 1000 gf/25 mm.

Figure 3C:
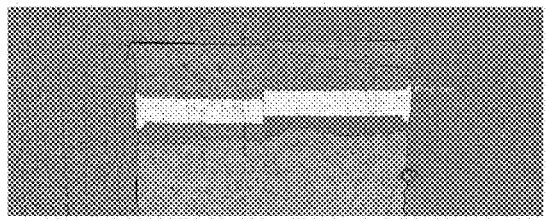
FIG. 3C shows a diagram illustrating an image resulting from experiments of manufacturing a part of the semiconductor package according to the embodiment of the present disclosure.

FIG. 3C shows a cross-sectional image after attaching the film structure 140 to the EMC in a case that the thickness is 60 μm, the modulus is 1 GPa, and the strength is 1500 gf.

Figure 3D:
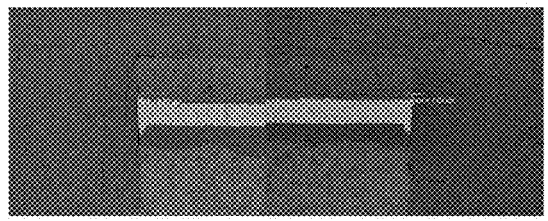
FIG. 3D shows a diagram illustrating an image resulting from experiments of manufacturing a part of the semiconductor package according to the embodiment of the present disclosure.

FIG. 3D shows a cross-sectional image after attaching the film structure 140 to the EMC in a case that the thickness is 40 μm, the modulus is 1 GPa, and the strength is 2000 gf/25 mm.

Referring to FIGS. 3A to 3D, it may be identified that through the experimental conditions applied to FIGS. 3A to 3D, a conductive layer may be formed.

Through the results of each experiment condition as shown in FIGS. 3A to 3D, the main conditions for manufacturing the semiconductor package 100 according to the embodiment of the present disclosure described above were determined.

Figure 4:
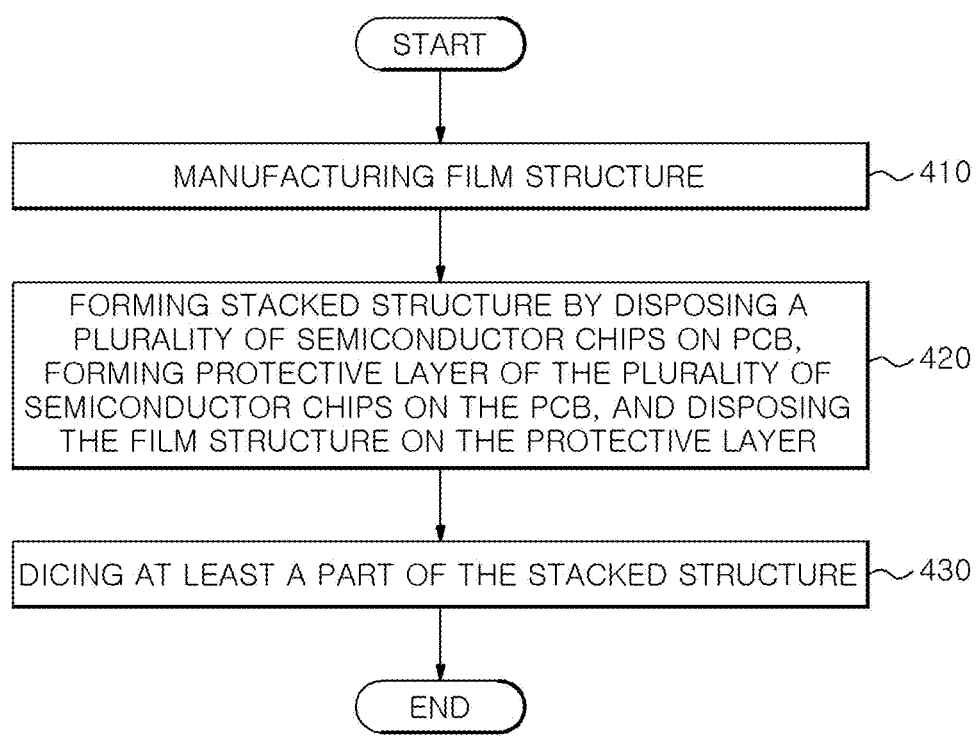
FIG. 4 shows a flowchart illustrating a method of manufacturing the semiconductor package according to the embodiment of the present disclosure.

FIG. 4 shows a flowchart illustrating a method of manufacturing the semiconductor package 100 according to the embodiment of the present disclosure.

In a step 410, the film structure 140 may be manufactured.

According to the embodiment, the film structure 140 may include the magnetic layer 141, the first polymer layer 143 disposed on an upper surface of the magnetic layer 141, and the second polymer layer 145 disposed on a lower surface of the magnetic layer 141.

In a step 420, a plurality of semiconductor chips may be disposed on the PCB strip 110, the protective layer 130 of the plurality of semiconductor chips may be formed on the PCB strip 110, and the film structure 140 may be disposed on the protective layer 130 to form a stacked structure.

According to the embodiment, the stacked structure may be a form shown in FIG. 1.

In a step 430, at least a part of the stacked structure may be diced.

According to the embodiment, the dicing may be performed by a rotating and cutting equipment, for example, a dicing blade.

According to the embodiment, at least a part of the stacked structure according to the stacking steps may be diced so that at least a part of an outer portion of the magnetic layer 141 has a thickness greater than that of an inner portion 25 of the magnetic layer 141.

For example, the dicing at least a part of the stacked structure may be dicing the center 10 between the first semiconductor chip 121 and the second semiconductor chip 123 shown in FIG. 1.

For example, the dicing may be performed so that at least a part of the outer portion of the magnetic layer 141 may include at least one of a form including an inclined surface inclined upwardly along a stacked direction and a form including an inclined surface inclined downwardly along the stacked direction.

According to the embodiment, forms of the outer portion of the magnetic layer 141 may be predetermined, and a rotation speed of the rotating and cutting equipment may be predetermined for each of the predetermined forms. Accordingly, the dicing may be performed by controlling the equipment according to a rotation speed corresponding to a form to be formed among the rotation speeds predetermined for each of the predetermined forms. For example, the dicing may be performed so that the semiconductor package 100 as shown in FIG. 2 may be manufactured.

Figure 5:
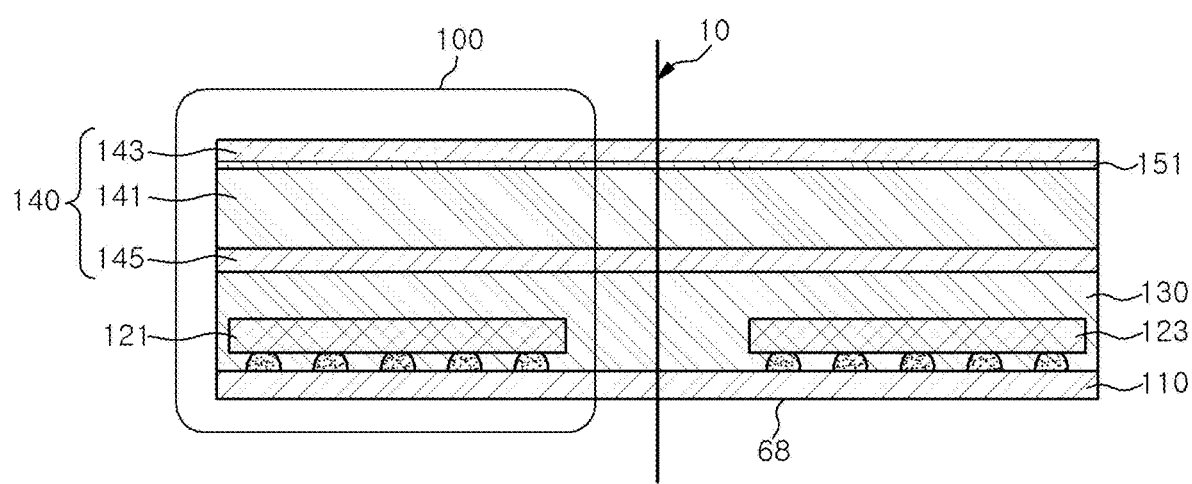
FIG. 5 is a view for explaining a dicing process when manufacturing a semiconductor package according to a modified embodiment of the present disclosure.
Figure 6:
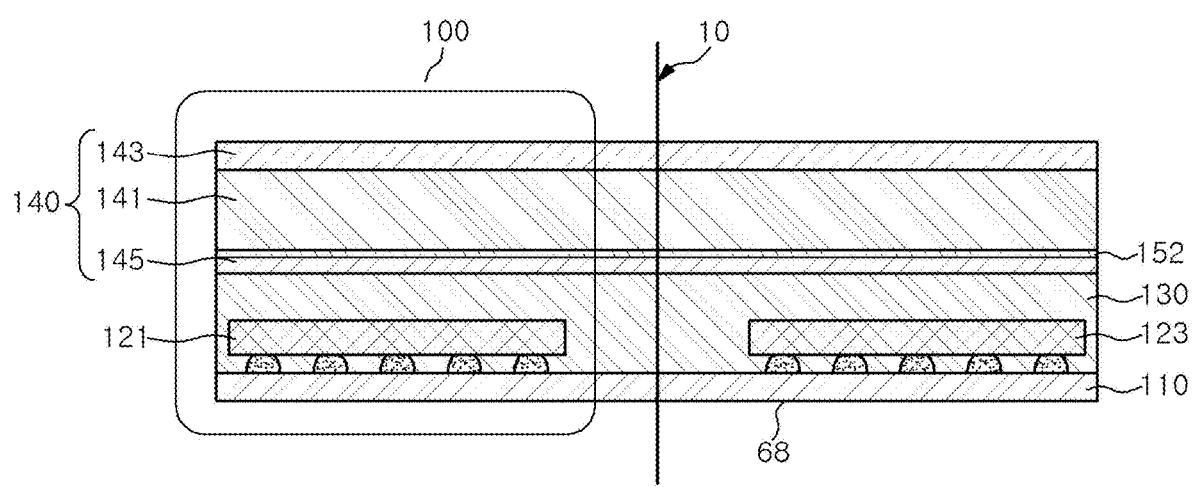
FIG. 6 is a view for explaining a dicing process when manufacturing a semiconductor package according to a modified embodiment of the present disclosure.
Figure 7:
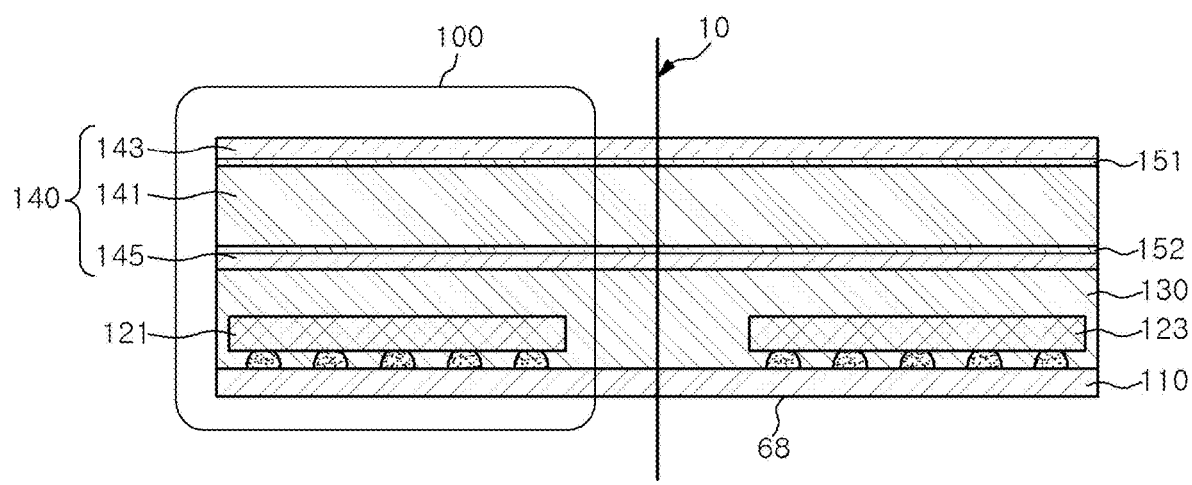
FIG. 7 is a view for explaining a dicing process when manufacturing a semiconductor package according to a modified embodiment of the present disclosure.
Figure 8:
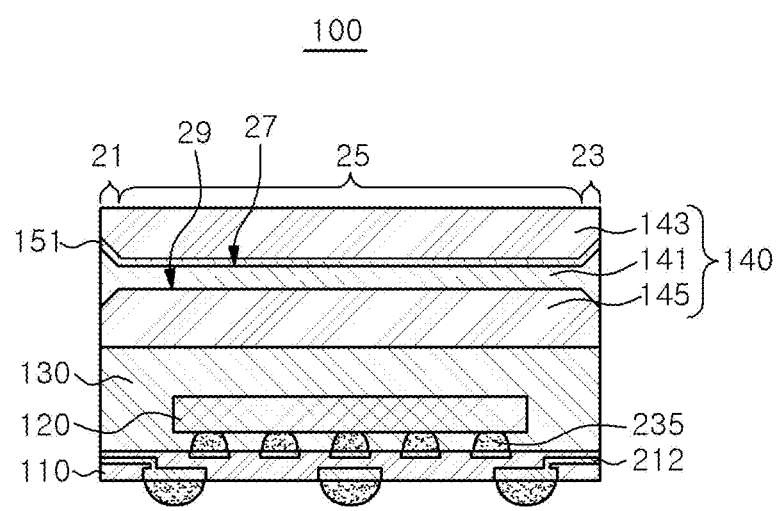
FIG. 8 is a view illustrating the semiconductor package according to the modified embodiment of the present disclosure.
Figure 9:
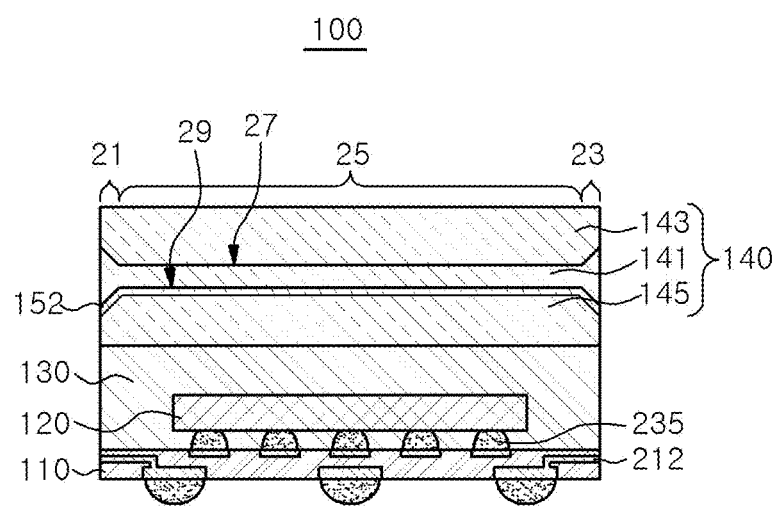
FIG. 9 is a view illustrating the semiconductor package according to the modified embodiment of the present disclosure.
Figure 10:
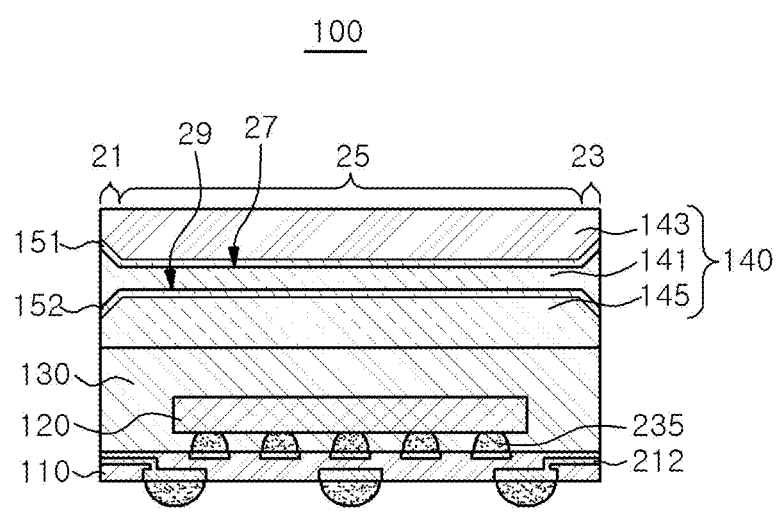
FIG. 10 is a view illustrating the semiconductor package according to the modified embodiment of the present disclosure.

FIGS. 5 to 7 are views for explaining a dicing process when manufacturing a semiconductor package according to a modified embodiment of the present disclosure. FIGS. 8 to 10 are views illustrating the semiconductor package according to the modified embodiment of the present disclosure.

Referring to FIGS. 5 to 10 according to the modified embodiment of the present disclosure, the semiconductor package 100 may include a printed circuit board (PCB) strip 110 (also referred to as a printed circuit board or circuit board), a first semiconductor chip 121 and a second semiconductor chip 123, a protective layer 130, and a film structure 140, a first adhesive layer 151 and a second adhesive layer 152.

The first adhesive layer 151 and the second adhesive layer 152 may include at least one of a solder wire, a solder paste, an epoxy-based adhesive, or a polymer including a thermoplastic resin such as PMMA (poly methyl methacrylate) and resin.

Referring to FIG. 5, a first adhesive layer 151 may be interposed between a lower surface of the first polymer layer 143 and an upper surface of the magnetic layer 141. The first adhesive layer 151 may serve to adhere the lower surface of the first polymer layer 143 and the upper surface of the magnetic layer 141 with each other. The first adhesive layer 151 may stably adhere the polymer layer 143 and the magnetic layer 141 between the polymer layer 143 and the magnetic layer 141 with strong adhesion.

Further, referring to FIG. 6, a second adhesive layer 152 may be interposed between an upper surface of the second polymer layer 145 and a lower surface of the magnetic layer 141. The second adhesive layer 152 may serve to adhere the upper surface of the second polymer layer 145 and the lower surface of the magnetic layer 141 with each other. The second adhesive layer 152 may stably adhere the second polymer layer 145 and the magnetic layer 141 between the second polymer layer 145 and the magnetic layer 141 with strong adhesion.

In addition, referring to FIG. 7, the first adhesive layer 151 may be interposed between the lower surface of the first polymer layer 143 and the upper surface of the magnetic layer 141, and the second adhesive layer 152 may be may be interposed between the upper surface of the second polymer layer 145 and the lower surface of the magnetic layer 141. The first adhesive layer 151 may stably adhere the polymer layer 143 and the magnetic layer 141 with strong adhesive force. The second adhesive layer 152 may stably adhere the second polymer layer 145 and the magnetic layer 141 with strong adhesive force.

Combinations of blocks in each block diagram and steps in each flowchart attached to the present disclosure may be executed by computer program instructions. Since the computer program instructions can be mounted on a processor of a general-purpose computer, a special purpose computer, or other programmable data processing equipment, the instructions executed by the processor of the computer or other programmable data processing equipment create a means for performing the functions described in each block of the block diagram or each step of the flowchart. The computer program instructions can also be stored on a computer-usable or computer-readable recording medium which can be directed to a computer or other programmable data processing equipment to implement a function in a specific manner. Accordingly, the instructions stored on the computer-usable or computer-readable recording medium can also produce an article of manufacture containing an instruction means which performs the functions described in each block of the block diagram or each step of the flowchart. The computer program instructions can also be mounted on a computer or other programmable data processing equipment. Accordingly, a series of operational steps are performed on a computer or other programmable data processing equipment to create a computer-executable process, and it is also possible for instructions to perform a computer or other programmable data processing equipment to provide steps for performing the functions described in each block of the block diagram and each step of the flowchart.

In addition, each block or each step may represent a module, a segment, or a portion of codes which contains one or more executable instructions for executing the specified logical function(s). It should also be noted that in some alternative embodiments, the functions mentioned in the steps may occur out of order. For example, two blocks or two steps illustrated in succession may in fact be performed substantially simultaneously, or the blocks or the steps may sometimes be performed in a reverse order depending on the corresponding function.

The above description is merely exemplary description of the technical scope of the present disclosure, and it will be understood by those skilled in the art that various changes and modifications can be made without departing from original characteristics of the present disclosure. Therefore, the embodiments disclosed in the present disclosure are intended to explain, not to limit, the technical scope of the present disclosure, and the technical scope of the present disclosure is not limited by the embodiments. The protection scope of the present disclosure should be interpreted based on the following claims and it should be appreciated that all technical scopes included within a range equivalent thereto are included in the protection scope of the present disclosure.

What is claimed is:

1. A semiconductor package comprising:
    a magnetic layer including an inner portion having a predetermined area and an outer portion disposed outward of the inner portion;
    a lower polymer layer disposed below the magnetic layer; and
    a dicing surface formed by ends of the magnetic layer and the lower polymer layer and extending along a stacked direction of the magnetic layer and the lower polymer layer,
    wherein at least a part of the outer portion of the magnetic layer includes an inclined surface inclined downward in the stacked direction, and has a thickness greater than a thickness of the inner portion in the stacked direction.

2. The semiconductor package of claim 1, further comprising:
    a conductive layer disposed above the magnetic layer.

3. The semiconductor package of claim 1, further comprising:
    an upper polymer layer disposed above the magnetic layer.

4. The semiconductor package of claim 3, wherein the at least the part of the outer portion of the magnetic layer further includes an inclined surface inclined upward in the stacked direction.

5. The semiconductor package of claim 3, further comprising:
    a conductive layer disposed above the upper polymer layer.

6. The semiconductor package of claim 3, further comprising:
    a first adhesive layer interposed between a lower surface of the upper polymer layer and an upper surface of the magnetic layer.

7. The semiconductor package of claim 3, further comprising:
a second adhesive layer interposed between an upper surface of the lower polymer layer and a lower surface of the magnetic layer.

8. The semiconductor package of claim 3, wherein each of the lower polymer layer and the upper polymer layer includes a polymer resin and a filler, and
a mixing ratio of the polymer resin and the filler is a ratio of 30% to 70% through 90% to 10%.

9. The semiconductor package of claim 3, wherein a thickness of each of the lower polymer layer and the upper polymer layer is 5 μm to 50 μm.

10. The semiconductor package of claim 3, wherein a modulus of each of the lower polymer layer and the upper polymer layer is 50 MPa to 50 GPa.

11. The semiconductor package of claim 3, further comprising:
a printed circuit board;
a semiconductor chip disposed on the printed circuit board; and
a protective layer of the semiconductor chip,
wherein the protective layer is disposed on the printed circuit board, and
the lower polymer layer is disposed above the protective layer.

12. The semiconductor package of claim 11, wherein at least one of an adhesion strength between the protective layer and the lower polymer layer, an adhesion strength between the magnetic layer and the upper polymer layer, and an adhesion strength between the magnetic layer and the lower polymer layer is 0.5 Kgf/25 mm or more.

13. A method of manufacturing a semiconductor package, comprising:
manufacturing a film structure including a magnetic layer, and a lower polymer layer disposed below the magnetic layer;
stacking the film structure on a semiconductor chip disposed on a circuit board; and
dicing at least a portion of a stacked structure formed by the stacking so that at least a part of an outer portion of the magnetic layer has a thickness greater than a thickness of an inner portion of the magnetic layer,
wherein, in the dicing, the at least the part of the outer portion includes an inclined surface inclined downward in a stacked direction of the magnetic layer and the lower polymer layer.

14. The method of claim 13, wherein, in the manufacturing, an upper polymer layer is disposed above the magnetic layer.

15. The method of claim 14, wherein, in the dicing, the at least the part of the outer portion further includes an inclined surface inclined upward in the stacked direction.

16. The method of claim 13, wherein a rotation speed of a rotating and cutting equipment is predetermined for each of predetermined forms of the outer portions, and
the equipment is controlled to rotate at the predetermined rotation speed corresponding to one of the predetermined forms of the outer portions in the dicing.

* * * * *